United States Patent [19]
Kaneko et al.

[11] Patent Number: 5,204,936
[45] Date of Patent: Apr. 20, 1993

[54] PROCESS STATUS SUPERVISORY SYSTEM

[75] Inventors: Kazue Kaneko, Kawasaki; Eiji Kato, Yokohama; Tsuneyoshi Takagi; Kazumasa Kumo, both of Tokyo, all of Japan

[73] Assignee: Canon Kabushiki Kaisha, Tokyo, Japan

[21] Appl. No.: 492,999

[22] Filed: Mar. 13, 1990

[30] Foreign Application Priority Data

Mar. 14, 1989 [JP] Japan .................................. 1-63259
Mar. 14, 1989 [JP] Japan .................................. 1-63260

[51] Int. Cl.$^5$ ............................................. G06F 15/18
[52] U.S. Cl. ................................................... 395/11
[58] Field of Search ................. 364/200, 900; 371/12; 395/11

[56] References Cited

U.S. PATENT DOCUMENTS

| | | | |
|---|---|---|---|
| 4,468,763 | 9/1989 | Masui et al. | 364/513 |
| 4,703,481 | 10/1987 | Fremont | 364/200 |
| 4,837,735 | 6/1989 | Allen | 364/513 |
| 4,849,879 | 7/1989 | Chinnaswamy et al. | 364/200 |
| 4,868,744 | 9/1989 | Reinsch et al. | 371/12 |
| 4,912,707 | 3/1990 | Kogcz et al. | 371/12 |
| 4,939,668 | 7/1990 | Brown et al. | 364/200 |
| 4,939,680 | 7/1990 | Yoshida | 364/513 |
| 4,964,060 | 8/1990 | Hertsog | 364/512 |

FOREIGN PATENT DOCUMENTS 0335380 10/1989 European Pat. Off. .

OTHER PUBLICATIONS

"Artificial Intelligence in Computer Aided Design", Computers in Industry 8(1987), 277–282, Jiroying et al.
IEEE Journal on Selected Areas in Communications, "Knowledge-Based Design Support System for Computer Communication System", T. Kinoshita et al., pp. 860–861, Jun. 1988, vol. 6, No. 5.
Proceedings of the 18th Southeastern Symposium on System Theory, "Distributed Expert Systems in Prolog", C. Biegl et al., pp. 279–84, Apr. 1986.
IBM Technical Disclosure Bulletin, "Checkpoint copy of Active/interactive Data with Imprecise Checkpoint Time", vol. 26, No. 3A, Aug. 1993, Ouchi, 1291–93.
Proceedings 14th International Conference on Fault-Tolerant Computing, "Optimistic Recovery: An Asychronous Approach to Fault-Tolerance in Distributed Systems", Jun. 1984, Strom et al., 374–79.
An introduction to Database Systems, vol. I, 4th Edition, 1986, C. Date, 413–19.

Primary Examiner—Robert L. Richardson
Attorney, Agent, or Firm—Fitzpatrick, Cella, Harper & Scinto

[57] ABSTRACT

There is disclosed an apparatus for supervising the status of processing performed in a system to be supervised which comprises: a first processing system having a first knowledge base, a first inference engine for making an inference with reference to the knowledge base and a data processing device for conducting the predetermined data processing in accordance with the inference for the purpose of conducting the predetermined data processing; and a second processing system having a second knowledge base and a second inference engine for making an inference with reference to the second knowledge base for the purpose of aiding the predetermined data processing conducted in the first processing system. The apparatus further comprises instruction device for instructing to determine whether or not the second processing system aids the first processing system for the purpose of aiding the predetermined data processing; and control device for causing the second processing system to execute the data processing device via the first processing system when it has been determined that the second processing system conducts the aid and for causing the first processing system to execute the data processing device when it has been determined that the second processing system does not conduct the aid.

19 Claims, 10 Drawing Sheets

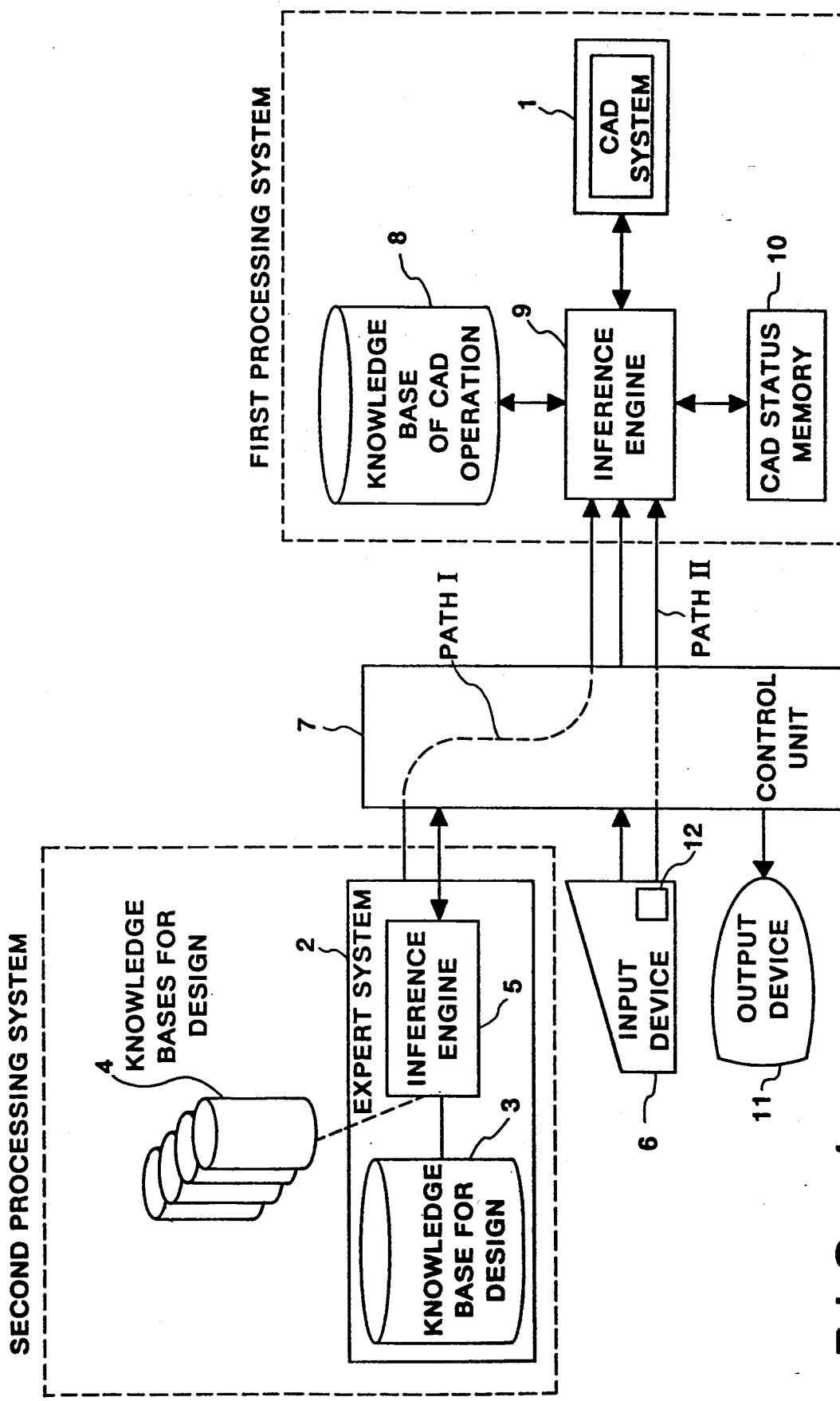
F I G. 1

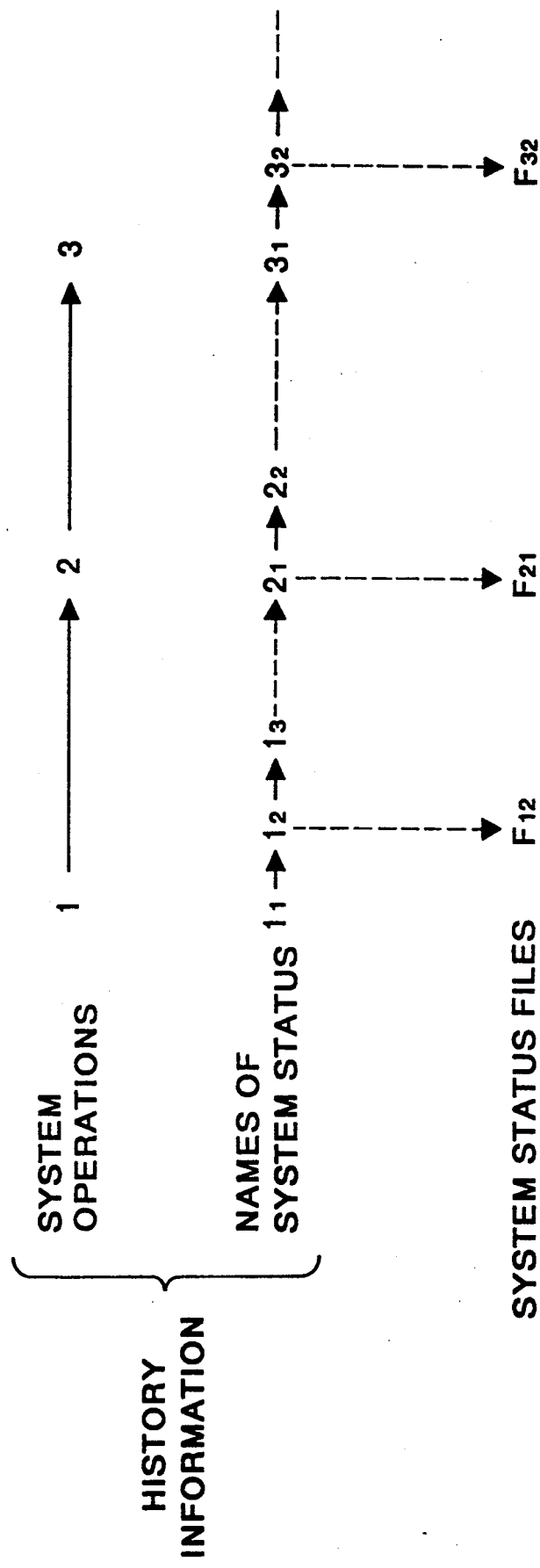
F I G. 5A

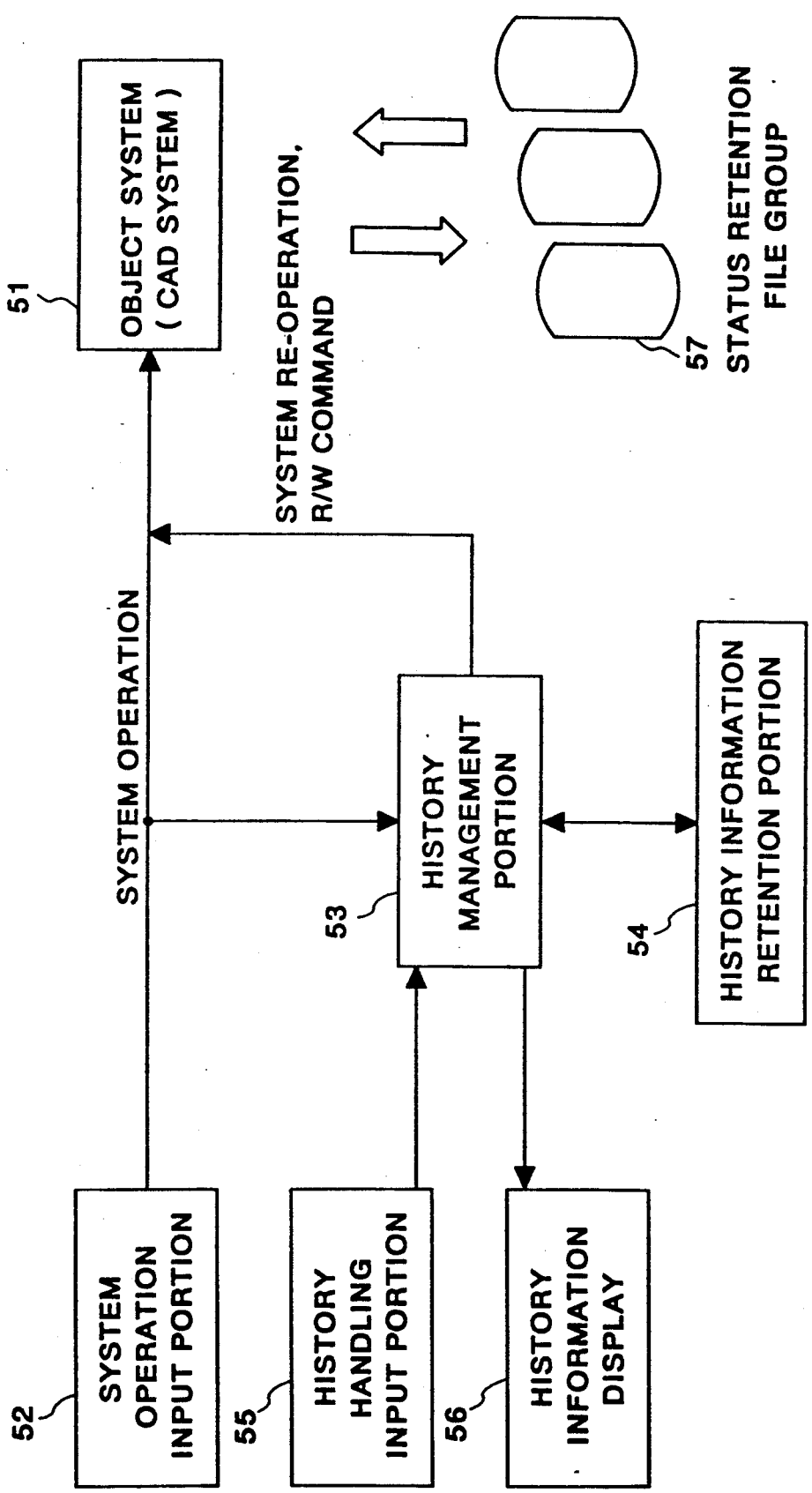
F I G. 5B c = ( STATUS NODE
        ( NAME 'c' )                                      : NAME OF STATUS ( OPTIONAL )
        ( JUST-PRIOR STATUS #b )                          : JUST-PRIOR STATUS NODE ( SINGLE )
        ( JUST-AFTER STATUS LIST ( #d#h ) )               : LIST OF STATUS NODES CHANGED FROM THE NODE
        ( CORRESPONDING FILE 'test 1. lens' )             : NAME OF FILE STORING STATUS ( OPTIONAL )
        ( OPERATION ( "r 4 30.00" "r 5 29.0" ) ) )        : LIST OF OPERATIONS PERFORMED
                                                            FROM JUST-PRIOR STATUS b TO STATUS c

PROCESS STATUS SUPERVISORY SYSTEM

BACKGROUND OF THE INVENTION

1. Field of the Invention

The present invention relates to a system for supervising the status of processing performed in a data processing apparatus which receives information and data-processes the thus received information. More particularly, the present invention relates to a supervisory system for the data processing apparatus of a knowledge information processing apparatus type using a knowledge base. Furthermore, the present invention relates to a system having a function of reproducing the inner status of the processing apparatus which is the status at an optional time with supervising the data processing apparatus, the inner status being changed in accordance with the operation applied to the system.

2. Prior Art

Recently, attempts of combining an expert system with a conventional information system have been made in order to utilize present software sources and saving labor taken place at the time of manual data input. For example, an attempt of combining an expert system and a CAD system has been made. The knowledge base system must have a knowledge of the operation of the object information-processing system in addition to the knowledge of solving usual problems.

However, if a sole knowledge base holds all of knowledge including that of solving usual problems and the operation of the information processing system and the like necessary to solve the subject problem, the knowledge base is excessively enlarged. As a result, the management of the knowledge base becomes difficult and the inference speed of the knowledge base is inevitably lowered. It might therefore be considered feasible to employ a structure arranged in such a manner that the knowledge is divided into sections to correspond to each of the problems so as to constitute each of the thus divided knowledge as an independent expert system. In this case, the knowledge base must have a knowledge of the operation of the object information-processing system and the like, causing its efficiency to be lowered.

It might be therefore be considered feasible to employ a structure arranged in such a manner that knowledge about the operations of the object information-processing system or the like are unified so as to be distinguished from knowledge of solving usual problems. It leads to a fact that the knowledge base can be easily managed and its efficiency is improved.

However, it is difficult for an expert system to completely solve a complicated design or programming problem such as a design of a CAD or linear programming. An operator must directly intervene in the system for the purpose of directing operating the object system after the execution or interruption of one operation of the expert system.

In the case that the interventions as described above has been made, data and the status of the object system have sometimes been changed when the expert system is restarted after the intervention of the operator. Therefore, a problem arises in that the data and the status of the object system held by the expert system and the actual data and the status after the change cannot be consistent with one another. Therefore, the data and the status must be reconstituted between the object system and the expert system. It leads a problem in that an operator cannot easily freely intervene in the system. An object of the present invention is addressed to overcome the problem of this type.

On the other hand, as a data processing apparatus becomes more complicated and its processing becomes thereby more advanced, the status reproduction at debugging and the status restoration after malfuction is complicated. Hitherto, supervisory methods employed in systems for supervising the data processing apparatuses of the type described above have been substantially classified as follows, in each of which only a status of the processing apparatus at a certain point or a status in an extremely short period including the certain point is always handled, and then operations arranged for the following methods are conducted:

(1) A method arranged in such a manner that the status at the present time and several statuses just prior the present time are saved and the just-prior operation can be cancelled by switching the thus saved statuses.

(2) A method arranged in such a manner that statuses expected to be necessary in the future are externally saved by an operator by design when the status is realized. When the status thus saved becomes necessary to be reproduced, it is searched from the saved statuses so as to be reproduced.

(3) A method arranged in such a manner that the operations from the processing start is recorded. When the operation which has been terminated is restarted due to the problem end, the operations thus recorded are executed again from the first portion of the record. Thus, the statuses just prior the trouble generation is reproduced.

However, according to the above-described method (1), only several just-prior statuses from present time are saved. Therefore, only the just-prior statuses can be reproduced.

According to the above-described conventional method (2), a user must save the statuses in an external device by making a backup or the like, causing a complicated task to be performed. Furthermore, since the statuses which have not been saved cannot be reproduced, the status saving must be conducted frequently. Therefore, the method (2) involves a disadvantage in that a large volume of external storage must be provided. In the case where a system whose subject is arranged to be the status in which its change is small, a method arranged in such a manner that the difference between the statuses is obtained and saved for the purpose of reducing the amount of storage can be employed. However, the method of this type cannot effectively act in a processing apparatus in which a great status change is involved. Furthermore, a more critical disadvantage than the problem in terms of the amount of the storage arises in that it is impossible to perfectly predict all of the statuses which will be necessary in the future.

Although the conventional method (3) can be effectively used as a method performed by an editor at the time of the trouble end, it involves a disadvantage in that its execution time for a processing is too long. Furthermore, it is not suitable for uses in a system such as a CAD whose amount of data to be calculated for one operation is great.

The method (2) involves a disadvantage in that the saved statuses are in the form of extremely small sections. Furthermore, a user must manage all of the relationships among the statuses in addition to the time sequential relationships (for example, the version of the status) and the causal relationships. Therefore, the user must conduct an additional complicated task. Furthermore, in the case of the method (1), only statuses within a certain period prior to the present time actually exist. Also in the case of the method (2), only the first and the final statuses exist.

SUMMARY OF THE INVENTION

Accordingly, an object of the present invention is to provide a supervisory apparatus for supervising a system structured by organically combining two inference systems so as to process data, said supervisory apparatus being capable of preventing said problems such as inconsistency between statuses of the two inference systems.

In order to achieve the object according to the present invention, there is provided a apparatus for supervising the status of processing performed in a system to be supervised which comprises: a first processing system having a first knowledge base, a first inference engine for making an inference with reference to the knowledge base and a data processing device for conducting the predetermined data processing in accordance with the inference for the purpose of conducting the predetermined data processing; and a second processing system having a second knowledge base and a second inference engine for making an inference with reference to the second knowledge base for the purpose of aiding the predetermined data processing conducted in the first processing system; said apparatus instruction means for instructing to determine whether or not the second processing system aids the first processing system for the purpose of aiding the predetermined data processing; and control means for causing the second processing system to execute the data processing device via the first processing system when it has been determined that the second processing system conducts the aid and for causing the first processing system to execute the data processing device when it has been determined that the second processing system does not conduct the aid.

That is, when one of the inference system (the first processing system) is arranged to be a major inference system and another one is arranged to be a follower inference system (aiding system) for the purpose of processing predetermined data for a CAD or the like and the second processing system is operated to process the predetermined data, it is operated with the first processing system. Thus, the above-described problem in terms of the non-alignment between the two inference systems can be prevented.

According to an aspect of the present invention, the data processing device is a CAD device, the first knowledge base is a CAD operation knowledge base and the second knowledge base is a CAD design aiding knowledge base.

According to an aspect of the present invention, input means is provided for inputting a manual input necessary for instructing the determination whether or not the second processing system is operated and processing the predetermined data. The system according to the present invention has a path formed as the first inference engine ←→ the control means ←→ the first inference engine and another path formed as the input means ←→ the control means ←→ the first inference engine. These paths use the same interface.

Another object of the present invention is to provide a status supervisory system capable of reproducing an optional status of an apparatus to be supervised in the past with the amount of storage of history information of the status change can be reduced and labor taken at the time of the operation conducted for the purpose of reproducing the desired status can be reduced.

In order to achieve the object, according to the present invention, there is provided a system for supervising the status of processing performed in a data processing apparatus for processing data and the internal status of which changes due to an input of operation information from outside, comprising: input means for inputting the operation information from outside; first storage means for intermittently storing information data representing the internal status of the data processing device which changes due to the input of the operation information; second storage means for storing the operation information in order of inputs and together with link information representing the relationship among the input operation information, the second storage means also storing correspondence information representing the correspondence between information data representing the internal status stored in the first storage means and the operation information; and restoring means for restoring the processing device to the status at a specific first point, the restoring means includes a retrieval means for retrieving operation information supplied between the first point and a second point in accordance with the link information and the correspondence information, where the second point is approximated to the first point in terms of a time period, and information data representing the internal status which corresponds to the second point is present in the first storage means; and execution means causing the retrieved operation information supplied between the first point and the second point to be again executed in the processing device from the internal status which corresponds to the second point.

That is, according to the supervisory system according to the present invention, the file storing the internal status of a system which must be provided with a large amount of storage capacity can be intermittently stored. Therefore, the capacity can be reduced. That is, in the case where the time whose internal status is not stored is necessary to be reproduced, the restoring means re-execute the operation information supplied between a first point and a second point of the processing device starting from the internal status corresponding to the second time. Therefore, the internal status corresponding to the first time which has not been stored in the first storage means can be reproduced.

According to an aspect of the present invention, when information data representing the internal status of the data processing device is stored in the first storage means, the second storage means stores, in its inside, the operation information, the link information and the correspondence information in accordance with the storage of the first storage means. That is, the file stored in the first storage means always has the correspondent file stored in the second storage means.

According to an aspect of the present invention, the second storage means stores the operation information, the link information and the correspondence information at an interval shorter than the storage operation performed by the first storage means. The interval is at least longer than the inputting of a plurality of operation information. Thus, the storage capacity of the first storage means can be further reduced.

According to an aspect of the present invention, the status of a specific first point can be specified in accordance with a display.

Other objects and advantages besides those discussed above shall be apparent to those skilled in the art from the description of a preferred embodiment of the invention which follows. In the description, reference is made to accompanying drawings, which form a part hereof, and which illustrates an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 1 is a block diagram which illustrates the overall structure of a first embodiment of the present invention;

FIG. 5A illustrates the principle of a second embodiment of the present invention;

FIG. 5B is a block diagram which illustrates the structure of the second embodiment of the present invention;

DESCRIPTION OF THE PREFERRED EMBODIMENTS

Figure 2:
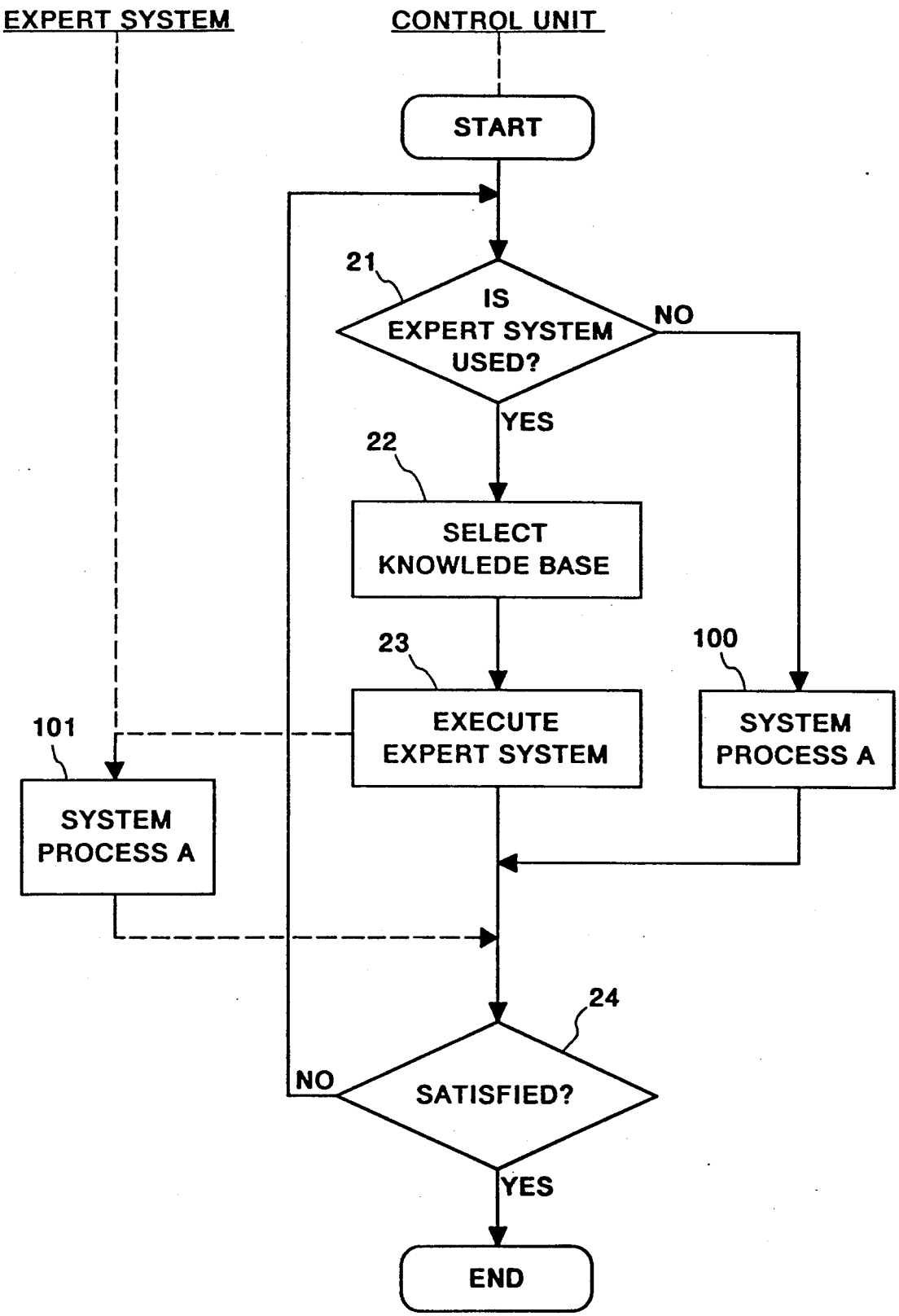
FIG. 2 is a flow chart for control procedures executed by an expert system and control unit of a system according to the first embodiment.

Two preferred embodiments (a first and a second embodiments) will now be described with reference to the drawings. Both the first and the second embodiments are structured in such a manner that the present invention is applied to a CAD (Computer Aided Deign) system. The CAD system according to the first embodiment is arranged in such a manner that an expert system for aiding a design and an inference system having a CAD operation knowledge base are combined with each other. Furthermore, the structure is arranged in such a manner that the expert system is used with the CAD, the operation is always performed through an inference system having the CAD operation knowledge base. The CAD system according tot he second embodiment is capable of reproducing the status of an optional past time with the amount of the storage and the labor taken for reproducing the status are reduced.

First Embodiment

FIG. 1 an overall structural view of the first embodiment of the present invention, where the subjects to be supervised is a first processing system and a second processing system. Reference numeral 1 represents a conventional information processing system which is, according to this embodiment, a CAD (a Computer Aided Design) system. Reference numeral 2 represents an expert system for aiding a design. The expert system (to be abbreviated to "an EX system" hereinafter) 2 and the conventional CAD system 1 are organically combined with each other as described later. Reference numeral 3 represents a design aiding knowledge base which stores a knowledge for solving a problem taken place at a certain design stage. Reference numeral 4 represents a design aiding knowledge base group which stores knowledge or solving problems taken place at a variety of design stages. Reference numeral 5 represents an inference engine for inferring based on the knowledge stored in the knowledge base 3.

Reference numeral 6 represents an input device for supplying predetermined inputs to the CAD system 1. The above-described predetermined inputs comprise, for example, the starting of the CAD system 1, the starting of the expert system 2, the temporarily terminating of these systems 1 and 2, and the like. Reference numeral 7 represents a control unit for controlling the inputs/outputs and the expert system 2, the control unit 7 having a storage portion, a processing portion and the like for storing control procedures shown in FIGS. 2, 3 and 4 and for executing them. Reference numeral 8 represents a CAD operation knowledge bases which store knowledge of operating the CAD system 1. Reference numeral 9 represents an inference engine for making an inference on the basis of the knowledge base 8. Reference numeral 10 represents a storage device for storing the status of the CAD system. Reference numeral 11 represents an output device for displaying the results of the execution or the like.

The operation of the thus constituted first embodiment will be specifically described with reference to FIG. 2 which is a flow chart for the overall structure of the knowledge base system according or the first embodiment, FIG. 3 which is a flow chart which illustrates an interrupt processing performed during execution of the processing shown in FIG. 2, and FIG. 4 which is a flow chart illustrating the system processing A shown in FIG. 2.

Figure 3:
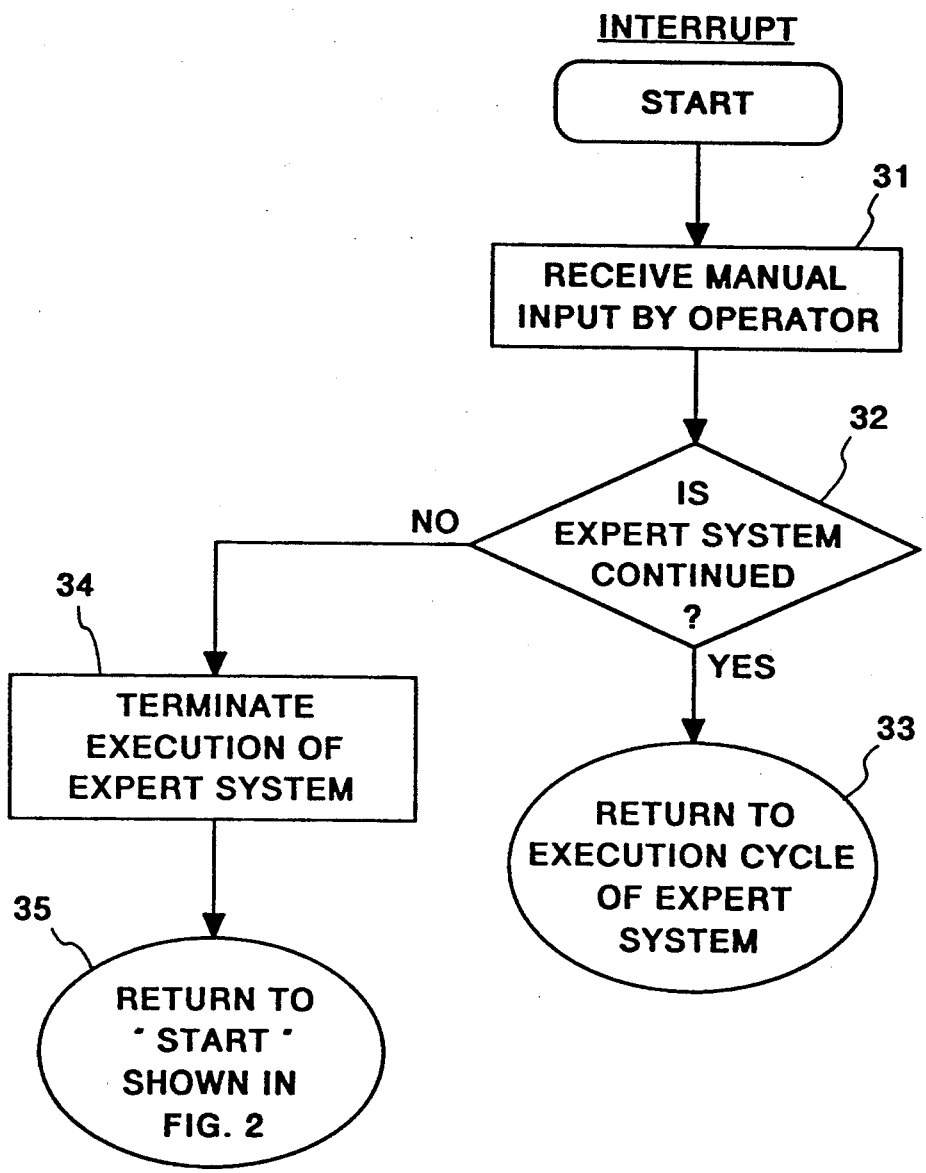
FIG. 3 is a flow chart which illustrates an interrupt processing performed during execution of the processing shown in FIG. 2.

FIG. 2 illustrates the procedure performed by the control unit 7 for interpreting the input from the input device 6. In the control procedure shown in FIG. 2, the control unit 7 acts to switch the path, where the path is expressed as "PATH I" in FIG. 1. The path structure according to this embodiment comprises a path arranged as: the EX system 2 ⟵⟶ the control unit 7 ⟵⟶ the inference engine 9 and path expressed by "PATH II" and arranged as: the input device 6 ⟵⟶ the control unit 7 ⟵⟶ the inference engine 9. That is, whether or not information which is necessary for the inference engine 9 of the CAD system 1 is obtained from the EX system 2 or from the input device 6, is controlled by the interpretation of a command received by the control unit 7.

The followings are examples representing the interface between the controller 7 and each of the expert system 2 and the input apparatus 6. The examples are written in the notation of Flavors message mechanism which is well used in LISP language.

(send controller : set-opt file "file 1")
(send controller : optimize 10)
(send controller : get-R 15)
(send controller : get-D 15)

The first example represents an instruction to the controller 7 that "file 1" should be set as optimizing parameter file. The second example represents an instruction that the optimization should be executed ten times. The third example represents an instruction that a design parameter R 15 is given via the controller 7. The fourth example represents an instruction that a design parameter d 15 is given via the controller 7.

As shown in FIG. 2, input information from the input device 6 to the whole system according to this embodiment is interpreted by the control unit 7 in step S21. The input information may be a command of starting a CAD design by using the expert system 2, or a command of directly causing the CAD system to act. In step S21, the control unit 7 interprets the supplied information, that is, the command so that it determines whether or not it uses the expert system 2.

For example, in the case where a command of operating a certain expert system is supplied from the input device 6, the type of the expert system requested is determined in step S21. In next step S22, the knowledge base 3 which meets the above-described request is selected from the knowledge base group 4. For example, a knowledge base for creating the initial stage of the subject to be designed is selected here. Then, the expert system 2 is executed in step S23.

In the thus started expert system, the system processing A shown in step S101 is executed via the control unit 7 so that instructions or data is sent to and from the CAD system 1 via the control unit 7.

If it has been determined in step S21 that the input from the input device 6 is not an input for operating the expert system, the flow advances from step S21 to step S100 in which the system processing A is executed. The input which is determined to be NO in step S21 is the command of a type which is difficult to be perfectly solved by only the expert system and causes for an intervention of an operator in the system to become necessary. The system processing A in step S101 with which the EX system 2 supplies command data to the CAD system 1 and the processing A in step S100 with which input an input command from the input device 6 to the CAD system 1 are the same processing which will be described later in detail with reference to FIG. 4.

Thus, the main procedure for executing a command issued from the input device 6 to start the expert system and a command directly supplied from the input device 6 to the CAD system 1 has been described. Then, a case where an operator interrupts the execution of the expert system and commands or data is to be sent directly to and from the CAD will be described with reference to FIG. 3. The reason for the interruption of the type described above to become necessary lies in that the above-described path I arranged as the system 2 ⟷ the control unit 7 ⟷ the inference engine 9 ⟷ the CAD 1 has been established during the execution of the expert system.

The above-described interruption is conducted by pressing a predetermined key (for example, "a break key 12" shown in FIG. 1) of the input device 6. When the above-described interruption has been made, the control procedure shown in FIG. 3 is executed. Then, the operator's manual input is received in step S31. In next step S2, it is determined that the thus supplied manual input causes a necessity of terminating the expert system which is being executed or it may be continued. If the above-described manual input is of a type which allows the expert system which is being executed to be continued, the flow returns to the expert system execution cycle. If the manual input causes the operation to be terminated, the execution of the expert system is terminated in step S34, and then the flow returns, in step S35, to the start of the control procedure shown in FIG. 2.

As described above, the command is supplied to the CAD 1 in accordance with the system processing A in step S100 or step S101 in both cases: the case in which the expert system 2 is executed and the CAD design is performed with using the knowledge stored in the expert system 2; and the case in which an operator directly intervenes and issues an instruction to the CAD system 1. That is, interfaces under the same program are used in the "PATH I" and the "PATH II". The interface in this case may be structured in such a manner that the control unit 7 is described as an object directional object and its message mechanism is used.

The system processing A is executed by the inference engine 9 by using the design CAD operation knowledge base 8 and a status storage device 10 of the design CAD system 1 in a manner as described later.

Thus, the design with the CAD is executed by using the expert system 2 or in accordance with the direct instruction from the input device 6. If it has been determined, in step S24, that the results of the above-described sequential processing are satisfactory, the design is ended. If it has been determined to be "NO", or if the flow advances to the next design step, a necessity of executing another expert system arises. It can be achieved by, for example, replacing the knowledge base 3 by a knowledge base or the like concerning the rough design.

Figure 4:
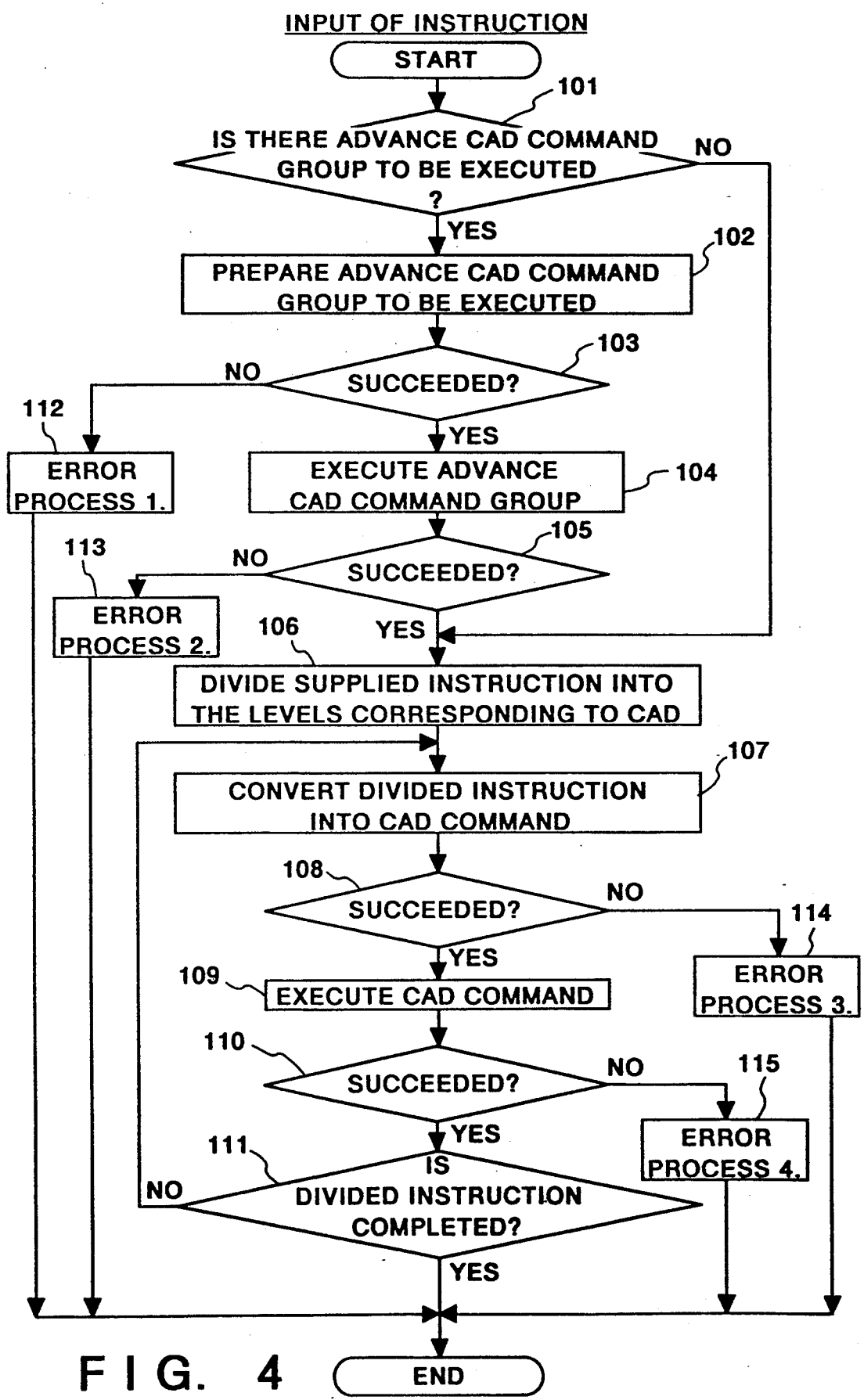
FIG. 4 is a flow chart which illustrates the system processing A shown in FIG. 2.

The system processing A (performed in steps S100 and S101) shown in FIG. 2 is performed in accordance with a flow chart shown in FIG. 4. The flow chart for the system processing A will be described, the system processing A being executed by the inference engine 9 under the control performed by the control unit 7.

When an instruction supplied from the input device 6 or the expert system 2 via the control unit 7 is executed, it is determined in step S101 whether or not there is a CAD command group to be in advance executed. If it has been determined that the CAD command group of this type exists, the flow advance to step S102 in which a CAD command is made by giving an argument or the like. In step S104, the thus made command is executed. The reason for the fact that the command to be in advance executed is prepared lies in that the usual CAD command or the like is in a predetermined application order and the instruction supplied cannot sometimes thereby be directly conducted depending upon the status of the CAD.

After all of the CAD commands to be in advance executed have been executed or if it has been determined that there is no command of this type, the instruction supplied from the control unit 7 is, in step S106, divided into levels which correspond to the CAD command. Then, the divided commands are, in step S107, successively converted into CAD commands so as to be executed in step S109. The processing in the steps S107 to S109 are repeated until it has been determined, in step S111, that all of the divided instruction have been ended. Error processing 112, 113, 114 and 115 are error handling processing in corresponding steps S102, S104, S107 and S109.

In the system shown in FIG. 1 (and according to the first embodiment), the knowledge of the operation of the design CAD serving the object information-processing system and the status of the same are collectively managed by the inference engine 9. The inference engine 9 is arranged to process both the input from the expert system 2 via the path I and the input from the input device 6 via the path II in the similar manner and by using one interface procedure. In other words, status data about the design CAD 1 is stored in the status storage device 10 and is not stored locally in the expert system 2. Therefore, the expert system 2 is not influenced by change in the status, data or the like of the design CAD 1. As a result, the immediate return to the expert system after the intervention of an operator can be conducted.

Modification to First Embodiment

The first embodiment may variously be modified. According to the first embodiment, the design aiding expert system is arranged to execute its operation by successively taking one knowledge base. However, the present invention may be similarly applied to any of the structures described as the conventional technologies or the other expert systems.

Furthermore, according to the first embodiment, the description has been made about the design CAD. However, the present invention can be similarly applied to a information processing system such as a data base system, a data analyzing package or the like having an operating external interface (for example, an interface with a higher language such as FORTRAN or C) and internal data of which can be subjected to a reference or can be changed. In addition, if the above-described information processing system includes a storage device for storing its status and the stored status can be subject to a reference by the knowledge base system according to the present invention, the status storage device 10 of the design CAD can be replaced by this.

According to the above-described examples, although the information processing system, the expert system and the other system are divided from one another, the fact whether or not the system according to the present invention is realized in a unit can be optionally selected.

Although the description has been made about the design aid field, the present invention is not limited to this description. For example, it can be applied to a various fields such as a translation, a document processing, a portfolio fields.

As is shown from the above-made description, according to the knowledge information processing system according to the present invention, a necessity of remodeling the object information-processing system (for example, the design CAD system 1) can be eliminated, that is, the available information processing system can be freely switched to be used by an expert system operation and the manual operation. Furthermore, since it holds the status of the object information-processing system and a knowledge base capable of conduct a processing corresponding to the status thus held, an effect can be obtained in that the operation of the object information-processing system can be simplified in both the knowledge description and the manual operation.

Second Embodiment

The second embodiment of the present invention is structured in such a manner that a status supervisory system is utilized for restoring a desired status. That is, a certain system is restored to its prior state according to this embodiment. The principle of the second embodiment is shown in FIG. 5A, and the structure of it is shown in FIG. 5B. The processing procedure to restore the past status will be described with reference to FIG. 6 in which the same is illustrated by frames, and to FIG. 7 in which the same is illustrated in a tree manner. Then, the flow of the control procedure according to the second embodiment will be described by dividing it into a system operation and a history handling with reference to flow charts shown in FIG. 8 and 9.

FIG. 5A schematically illustrates the process of the status change taken place in the system to be supervised due to the system operation. According to this embodiment, the description "the system operation" is an operation for executing the CAD system as an object system. When a certain system operation 1 is supplied to this system, the internal status of the system is changed ad $1_1 - 1_2 - 1_3 - \ldots$. When another system operation 2 is supplied to the system, the internal status of the system is changed as $2_1 - 2_2 - 2_3 - \ldots$. According to an example shown in FIG. 5A, the internal status of the system is not always stored, but only the internal status $1_2$ is stored as a file $F_{12}$;, only the internal status $2_1$ is stored as a file $F_{21}$, and only the internal status $3_2$ is stored as a file $F_{32}$. As a result, the amount of storage can be reduced. Referring to FIG. 5B, the system status files such as $F_{12}$ or the like are expressed by a file group 57.

According to the second embodiment, the relationship among the system status file $F_{12}$ and the like, the system operation and the system status name $1_2$ and the like are stored as history information. The history information is, referring to FIG. 5B, is stored in a history information retention portion 54. The relationship between the history information and the system status file will be more apparent from the description which will be made with reference to FIGS. 6 and 7.

Referring to FIG. 5B, reference numeral 51 represents a CAD system whose status to be supervised. The CAD system 51 comprises the design CAD device 1, the operation knowledge base 8 and the inference engine 9 of the first embodiment system shown in FIG. 1. The status of the CAD system 51 is stored by a status retention file group 57. Reference numeral 52 represents an input portion which receives an input operation instruction issued to the system 51, the input portion 52 serving similarly as the input device 6 according to the first embodiment. The "system operation" supplied through the input portion 52 is, as described above, stored as "the history information" in the history information retention portion 54.

Figure 8:
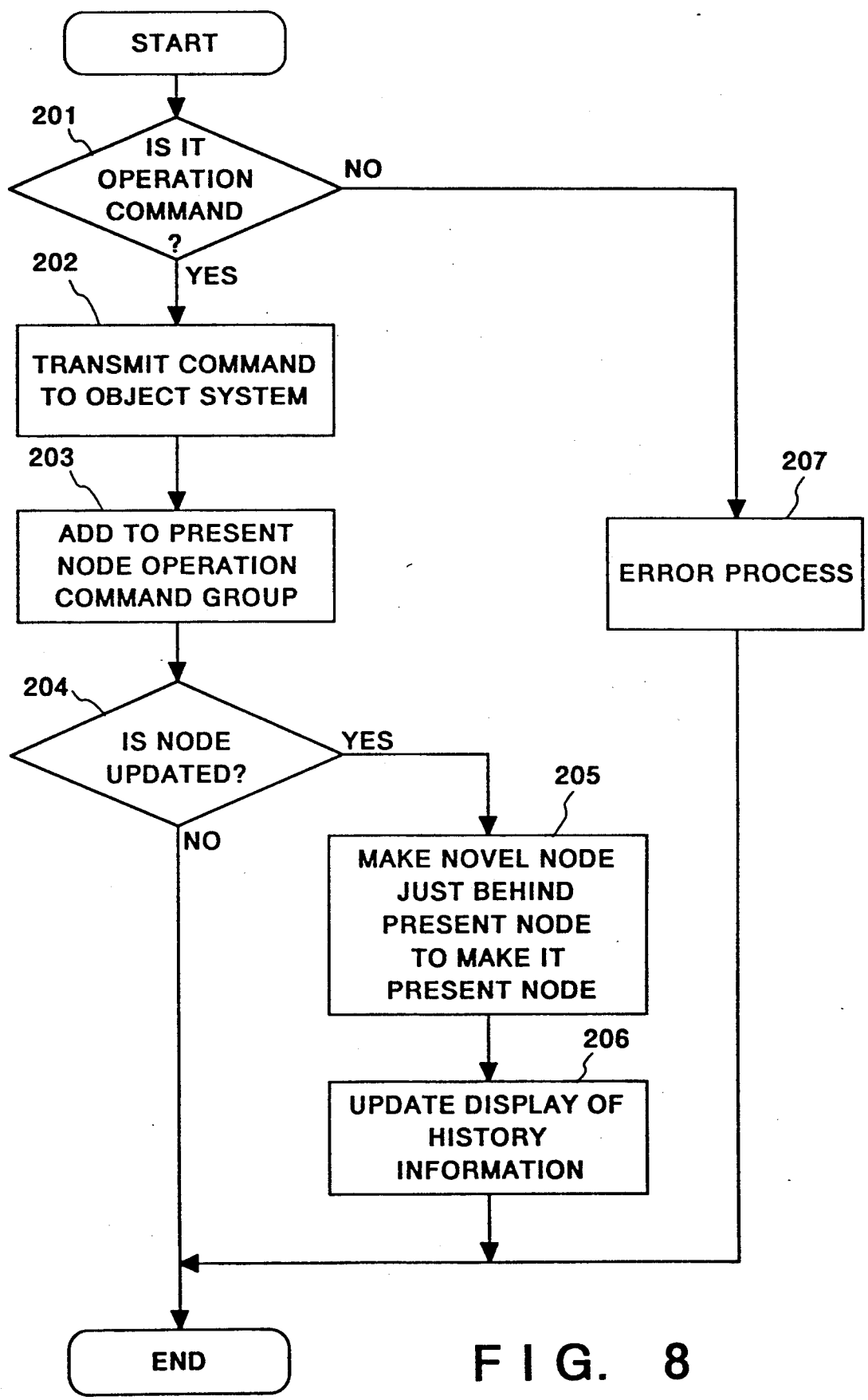
FIG. 8 is a flow chart which illustrates the processing in the system operation according to the second embodiment.

Reference numeral 53 represents a management portion for issuing an instruction to make history information and an instruction to perform a retrieval, the management portion 53 being arranged to store and execute the processing procedures shown in FIGS. 8 and 9, respectively. The operation instruction used according to the second embodiment comprises:

(1) An instruction to cause the "system operation" serving as operation history information to be stored in the storage portion 54

(2) An instruction to cause the stored history information to be displayed in a display portion 56

(3) An instruction to specify the status of the object system to be restored with reference to the display (see FIG. 7) displayed on the display portion 56

Figures 6, 7:
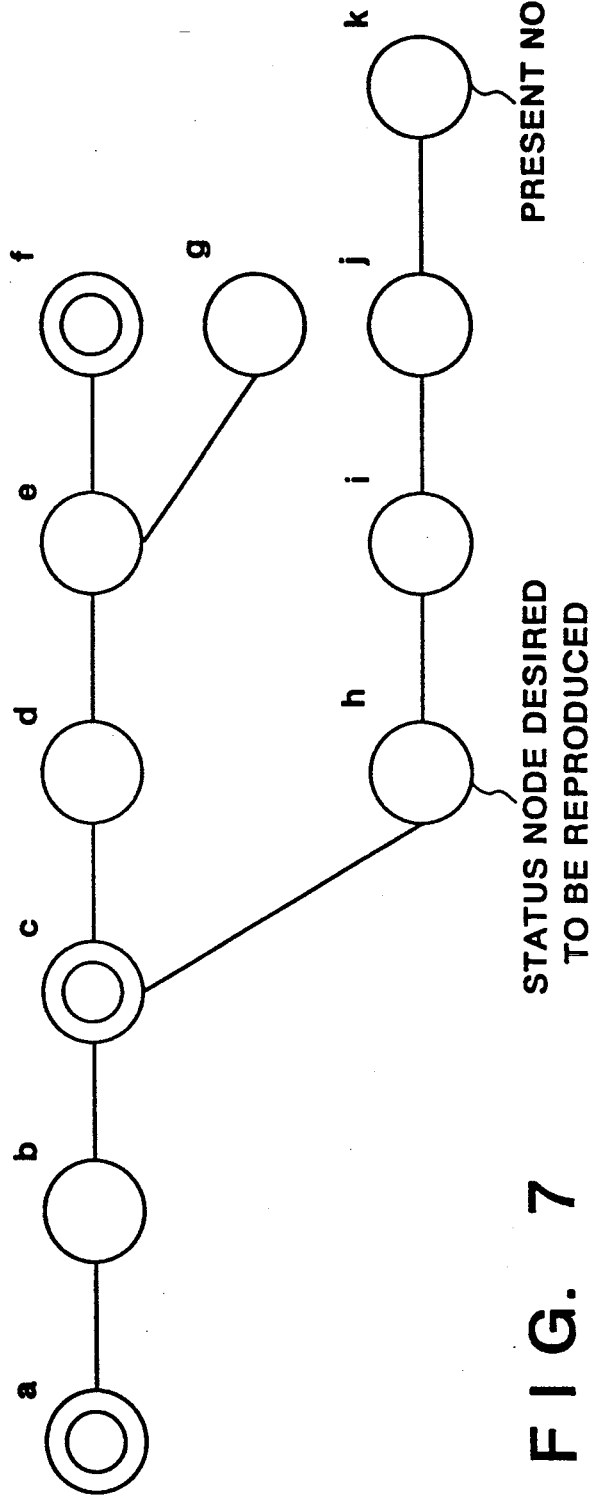
FIG. 6 illustrates, by structural data, the internal status of an object system which is under supervisory and also illustrates the contents of the data in the form of frames.
FIG. 7 illustrates, in a tree form, the history of the status changes.

The input portion 55 supplies the above-described handling instructions from an operator. Reference numeral 56 represents, as described above, the display portion for displaying history information. For example, the display is made as shown in FIG. 7.

The "system operation" for the system 51 is supplied through the system operation input portion 52 so as to be then supplied to both the object system 51 and the history management portion 53. The history management portion 53 causes the operation thus supplied to be stored in the history information retention portion 54. An instruction to reproduce the status or the other instruction are supplied through the input portion 56 so as to be then supplied to the history management portion 53. The management portion 53 acts in accordance with handling instruction therefor.

When a certain status of the object system is desired to be reproduced, it is important that how the status of the system has changed is schematically displayed. In order to readily display the way of the status change of the system, information necessary to reproduce a certain status of the system is realized by a structure data called "a status node" in the supervisory apparatus according to the second embodiment. FIG. 6 illustrates an example of the "status node".

In order to realize the status reproduction, a expression method for handling the process of the status change is necessary. Therefore, data having the "status node" structure is generated in correspondence with the status of the system 51 at the certain time and the thus generated "status node" are connected to each other so that the history of the system status is expressed by the tree of the status nodes.

The attributes of the status node are classified into a "name" field, a "just-prior status" field, a "just-after status" field, a "corresponding file" field, a "operation" field and the like. FIG. 6 illustrates an example of the status node named c. The above-described attributes will be described with reference to FIG. 6:

(i) Name

Name given the status and serving so as to be distinguished by a user. Name can be abbreviated, for example to "c", as shown in FIG. 6.

(ii) Just-prior status

The status with which the status named C is created. Referring to FIG. 6, status b exists just prior to status c.

(iii) Just-after status list

The status created from the status c. According to the second embodiment, since making-up from a certain status is allowed freely, a plurality of the "just-after" statuses can be stored. According to the example shown in FIG. 6, there are statuses d and h as the just-after status to c.

(iv) Corresponding file name

According to the supervisory system of the second embodiment, not all of the statuses of the system 51 are always stored because it is necessary to reduce the volume of the file as described with reference to FIG. 5A. The attribute "corresponding file name" represents the file name stored in the file group 57 if the status of the subject node has been stored. According to the example shown in FIG. 6, the status c is stored with a name "test1.lens". If a certain status is only given a name and is not recorded, the "corresponding file name" is omitted.

(v) Operation list

The "operation list" represents operation inputs supplied through the operation input portion 52 from the status shown as the "just-prior status" to the status given "a name". Referring to the example shown in FIG. 6, it is illustrated that an operation named "r430.00" and an operation named "r529.0" have been conducted.

The above-described structure arranged as shown in FIG. 6 serves as only an example. Another example may be employed, for example, in which information such as the "operation list", the "just-prior status" and the "just-after status" are displayed with arcs so as to be expressed by a tree structure.

FIG. 7 illustrates a manner in which a plurality of status nodes are related to one another and thus related status nodes constitute the change (history) of the status in such a manner that circles showing the status nodes and lines showing the change between the status nodes are used so as to form a tree.

The example shown in FIG. 6 can be visually understood by making a reference to FIG. 7. That is, it is apparent from the example shown in FIG. 6 that the status node named "c" was created from status node named #b, and operation named "r430.00" and operation named "r529.0" were performed from the status of node named #b to the status of node named #c. Furthermore, the status named "c" was stored with file name "test1.lens" and two status nodes named #d and #h were created from the status node c.

In the case where an input through the input portion 55 to handle the history information is an instruction to reproduce a certain status, the management portion 53 retrieves the specified history information in the storage portion 54 so as to display it on the display portion 56 as shown in FIG. 7. Furthermore, the management portion 53 takes necessary status files from the file group 57 and supplies "system operation" instructions to be executed again to the object system 51 so that these "system operations" are executed again. On the other hand, information about the change in the history in the above-described re-execution process is transmitted to the history information display portion 6. The history information display portion 6 notifies this status change on the basis of the thus supplied information to a user by display means. A structure may be constituted in such a manner that the display is graphically display by means of a directed tree and the reproduction instruction is made by a selection by using a pointing device. In this case, the input portion 55 and the history information display portion 56 can be integrally formed.

In general, a history is started to be formed by arranging a status having no just-prior status to be its root. An end of the history tree represents the present status and the way of its growth comprises two types of components: the connections of lines formed during the processes in accordance with a time lapse; and branches of a status change process formed by reproducing the past statuses.

The status nodes shown in FIGS. 6 and 7 are updated at a predetermined timing. The updating is conducted in the following cases when the operation is conducted in accordance with a time lapse:

(vi) when the present status was stored in the retention portion 54

(vii) when a status node was given a name by design for the purpose of distinguishing the status (viii) when the "system operation" was conducted many times after the status node had been updated previously or a long time has passed (ix) when an operation taking an excessively long time was conducted (x) when an operation which is considered to be important for the object system 51 was conducted.

The above-described updatings can be considered to be conducted when a determination has been made that it is a status which must given a mark. When an updating is conducted, a novel status node is made immediately after the present status node and the thus-made novel status node is arranged to be the present status node. Thus, the tree can grow in the form of a linear shape.

When a certain past status is desired to be reproduced, a novel status node is made immediately after the reproduced past status node. Then, the thus made novel status node is added to the "just-after status list" of the reproduced status node and the thus added status node is arranged to be the present status node. As a result, the tree can create a novel branch and can grow.

Then, a method of reproducing a status will be described with reference to FIG. 7. It is assumed that only a, c and f stored shown in FIG. 7 are stored in the file group 57. The thus status-stored nodes a, c and f are expressed with double-circle symbols. Assuming that the present node is k and the "system operation" which is being conducted in the system 51 is an operation for changing the status from j to k, it is stored as history information in the node k. If a necessity of restarting the operation from the status h arises, the node h is first examined in response to an instruction to reproduce the node h supplied from the input portion 55. Since the status of this node has not been stored, the arc for the node h is retracted in accordance to the time sequence and the node c is examined. Since the status of the node c has been stored, a file corresponding to the node c is taken from the file group 57 so that the status of the node c can be reproduced. Then, the arc for c is retracted toward h so as to examine the node h and make a reference to the operation list (the "system operation" which was performed in the past for making the node h from the node c) stored in h. Then, these "system operations" are again transmitted to the system 51 in which they are executed again. Thus, the status of the node h can be reproduced. Furthermore, a history handling is conducted for the purpose of advancing the operation from the status h in such a manner that a novel status node is made after the node h and the thus-made novel node is arranged to be the present node.

FIG. 8 illustrates the control procedure for making the history information and storing the information. Specifically, FIG. 8 is a flow chart which illustrates the flow of the processing when a system operation input has been supplied from the input portion 52 shown in FIG. 1. In step S201, it is examined by the management portion 53 whether or not the operation input is the operation command. If it has been determined that it is not the operation command, an error processing in step S207 is conducted and the processing is ended. If it is an operation command, the operation command is as it is supplied to the object system 51 in step S202. Furthermore, the command is, in step S203, stored into the "operation list" of the present status node in the storage portion 54. Then, in step S204, whether or not the updating of the node is conducted is determined in the management portion 53. The determination whether or not the updating is conducted is made depending upon the above-described criteria (vi) to (x). If it has been determined that no updating is conducted, the processing corresponding to this input command is ended.

If it has been determined, in step S204, that the updating is conducted, a novel node to be disposed next to the present node is, in step S205, made so as to arrange to it as a present node. Then, in step S206, the display of history information on the display portion 56 is updated and the processing is ended.

Figure 9A:
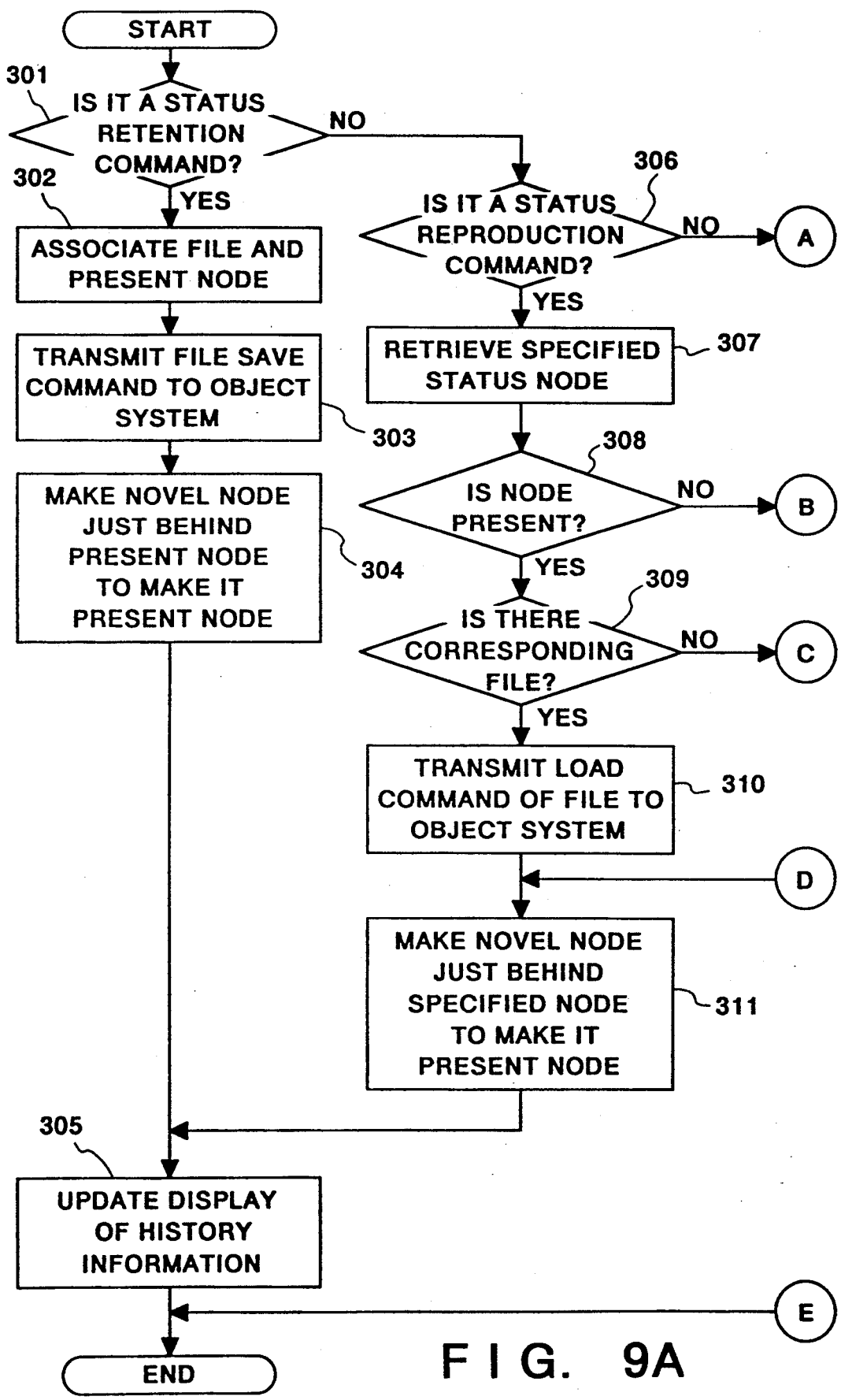
FIGS. 9A and 9B are flow charts which illustrate the processing of the history handling.
Figure 9B:
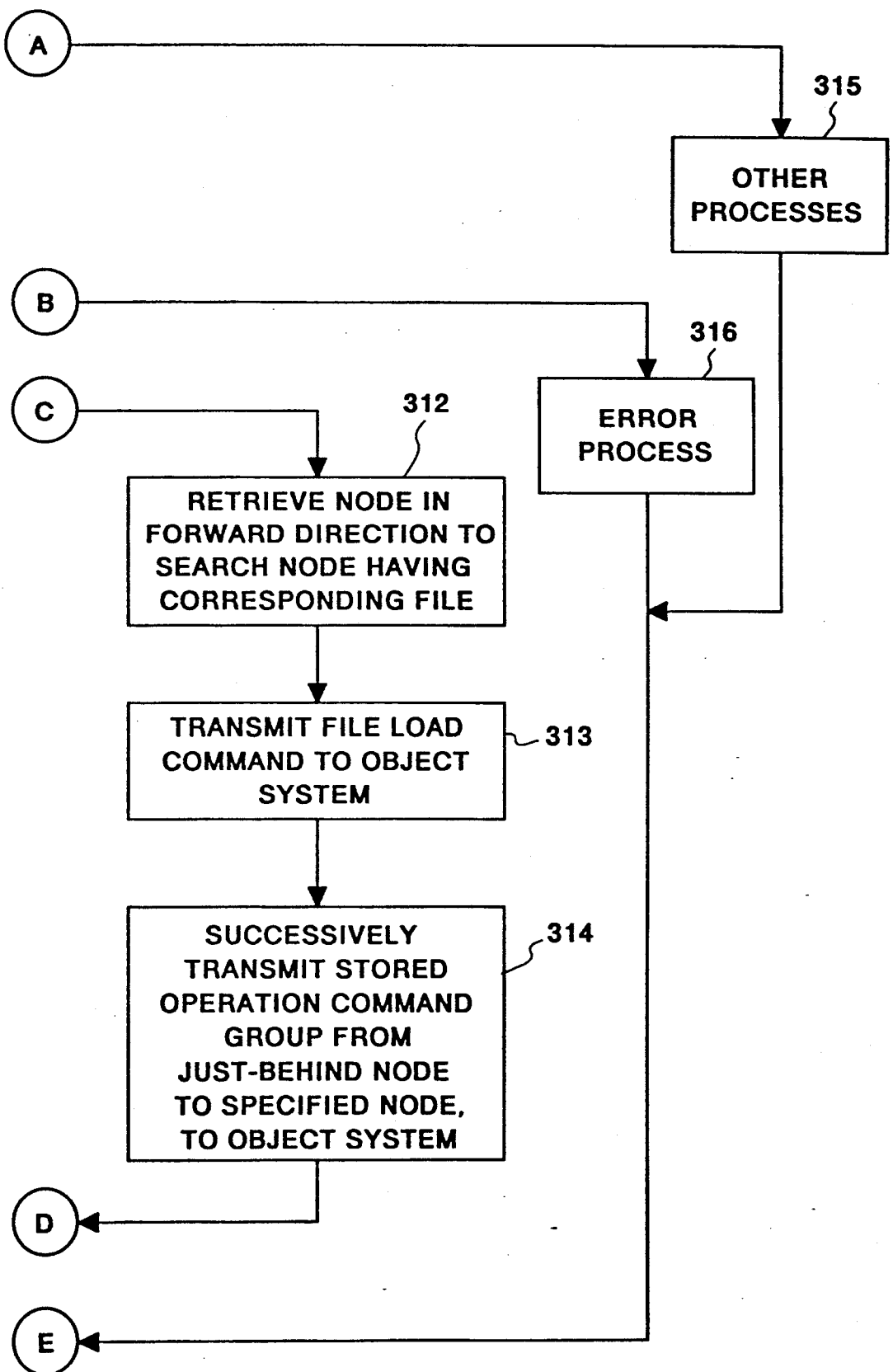

FIGS. 9A and 9B are flow charts which illustrate the flow of the processing when an input has been supplied through the input portion 55. First, if it has been determined in step S301 that the input is a command to restore the status, a processing of writing the file name in the present status node or the other processing are conducted in step S302 so that the files stored in the file group 57 and the subject node are made correspond to one another. Then, in step S303, a command of saving the present status of the system 51 in the file group 57 is transmitted to the object system 51. The system 51 which has received the above-described command files the present status in the status storage file group 57. Then, in step S304, a novel node is made immediately after the present node so as to arrange it as a new present node. Finally, in step S305, the history information is displayed again, and the processing is ended here.

If it has been determined in step S301 that the command supplied through the input portion 55 is not the command to store a status, the flow advances to step S306 in which it is determined whether or not the thus supplied input is a command for reproducing the status. If it has been determined that the input is the command to reproduce the status, the flow advances to step S307 in which the status node specified with this command is retrieved in the history information storage portion 54.

A variety of ways can be employed to specify a status to be reproduced with a reproducing command. For example, a structure may be, for example, employed in which a user specifies the reproduced status by using a pointing device (omitted from illustration) disposed in the input portion 55 with looking at the history information graphically displayed on the display portion 56 as shown in FIG. 7. In this case, the retrieval performed in step S307 is conducted by matching the pointed position and the position of the displayed node. In the case where the specification of the status is conducted by typing the name of the node through a keyboard positioned in the input portion 55, the retrieval of the node by means of the name is conducted in step S307.

If it has been determined in step S308 that the retrieval has been failed, the error processing in step S316 is conducted, and the processing is ended. The failing in the retrieval can take place when, for example, a node which does not exist is erroneously specified. When a desired node has been found in the storage portion 54, the flow advances to step S309 in which it is determined whether or not there is a storage node corresponding to the node in the file group 57. If it is determined that there is the corresponding file, the flow advances to step S310 in which a read command is supplied to the object system 51 for the purpose of reading the file.

The system 51 which has received the read command reads the subject command and set itself to the status which has been written in the file.

In step S311, the management portion 53 makes a novel node immediately after the node which has been specified by the status-reproduction command so as to arrange the novel node as the present node. The flow then advances to step S305 in which the display on the display portion 56 is updated.

If it has been determined in step S309 that there is not corresponding file, the flow advances to step S312 in which the "just-prior status node" field of the node specified by the reproduction command is read and data of the "just-prior status node" is searched in the history information storage portion 54. Then, the "corresponding file" field for the "just-prior status node" is examined. The above-described retroaction operation is repeated until a node having the corresponding file is found.

When the above-described node has been found, the flow advances to step S313 in which a command for reading the corresponding file to the node is transmitted to the object system 51.

Then, in step S314, the flow advances the route for searching the node which has been retroacted in step S312 in the opposite direction so that the system 51 is caused to act to restore the status of the system 51 to the specified status. That is, referring to FIG. 7, assuming that the specified status is h and the corresponding file has been found in the node c, the "system operation" which has been supplied through the input portion 52 is read from the "operation" field during the shift from the node c to the node h. The thus read "system operations" are successively transmitted to the system 51 in the order of the storage in the node.

The system 51 which has received the "system operation" executes again the operation commands in the order of the reception. Thus, the system 51 can be restored to the status which has been specified by the reproduction command.

The flow then advances to S311 after the processing in step S314 have been conducted and a novel node is made by the management portion 53.

If it has been determined in step S306 that it is the other operation command, that is, it is a command to display, for example, the history information in a further detailed manner, the flow advances to S315 in which the processing to meet the above-described command is conducted, and the processing is ended.

Modification to the Second Embodiment

According to the structure (shown in FIG. 1) of the second embodiment, input/output which concerns with the history handling is separated from the object system 51. That is, the input portion 55 for handling the history and the input portion 52 for operating the object system 51 are separated from each other. The reason for this lies in that the status reproduction function is provided for the management portion 53 or the like outside the object system 51. However, the present invention is not limited to this structure. That is, a structure may be employed in which the status reproduction function according to the second embodiment will be included as a function of the object system 51 so as to combine the two input portions 52 and 55. Another structure may be employed in which the display portion 56 is replaced by a display portion (omitted from illustration) of the system 51.

According to the second embodiment, the processing from steps S312 to S314 shown in FIG. 9 are conducted in such a manner that the retrieval of the stored status nodes is limited to the previous nodes only in terms of time. However, the present invention is not limited to the above-described structure. That is, in the case where the object system is of a type which can be operated in both directions, the present invention may be structured in such a manner that the node retrieval can be conducted in either of the forward or the rearward direction. That is, the retrieval direction can be determined in terms of the shortening the time take for the reproduction operation.

The processing in steps S204 and S205 according to the second embodiment shown in FIG. 8 may be conducted by checking by means of a time start as an alternative to the illustrated timing.

In step S203 according to the second embodiment shown in FIG. 8, all of the operation histories are stored and in step S314 all of the stored operation histories are conducted. However, the structure may be modified into a structure in which only an operation which causes the status to be changed is stored. Alternatively, only the operation of the type described above is executed.

According to the second embodiment, in steps S205 and S206 shown in FIG. 8 and steps S311 to S305 shown in FIG. 9, the display is again conducted whenever the node is updated. However, in the case where the display does not appear, a structure may be employed in which information of the updating is stored in a specific buffer and the re-displaying is conducted when the display can appear.

According to the above-described status supervisory system of the second embodiment and its modification, a history for the system to be supervised is made by storing the status at a certain time and by using an operation record conducted between two of the thus stored statuses so as to combine the thus obtained information items. As a result, any status which has realized in the past can be reproduced.

Furthermore, the change in the status of the object system of the supervisory apparatus can be expressed in the form of a connected shape by storing the statuses at certain times and by using a record of operations conducted between two of the thus stored statuses. The process of the operations can be expressed by a directed tree (a novel branch of a status change is created from the reproduced status) having a causal relationship as an alternative to a form of a linear shape in terms of a time lapse. Therefore, it can be readily understood. That is, the branching depending upon the causal relationships can act as an effective expression means in a field in which a large number of trials and errors are involved, causing the possibility of a design to be widened. For example, an operation of applying a different operation to a certain status for the purpose of making a comparison of the results can be made easier.

The present invention is not limited to the above embodiments and various changes and modifications can be made within the spirit and scope of the present invention. Therefore, to apprise the public of the scope of the present invention the following claims are made.

What is claimed is:

1. An apparatus for supervising the status of processing performed in a system to be supervised which comprises:

first processing means having a first knowledge base, first inference engine means for making an inference with reference to said first knowledge base and data processing means for providing control for conducting a predetermined data process in accordance with the inference made by said first inference engine means; and second processing means having a second knowledge base and second inference engine means for making an inference with reference to said second knowledge edge base for the purpose of providing further control over the predetermined data process conducted in said first processing means; said apparatus comprising:

determining means having input means for manually inputting necessary operation information for providing control over the predetermined data process, said determining means in response to the input means determining whether or not said second processing means should provide further control over the predetermined data process conducted in said first processing means; and control means for causing said second processing means to start the predetermined data process conducted in said first processing means when said determining means determines that said second processing means is to provide further control over said first processing means or for causing said first processing means to start the predetermined data process when said determining means determines that sad second processing means is not to provide further control over said first processing means.

2. An apparatus according to claim 1, wherein said data processing means comprises a CAD device, said first knowledge base comprises a CAD operation knowledge base and said second knowledge base comprises a CAD design aiding knowledge base.

3. An apparatus according to claim 1, wherein said input means inputs necessary operation information for determining whether or not said second processing means is to provide further control over the predetermined data process, wherein said first inference engine means is connected to each of said second inference engine means and said input means by said control means, and wherein information data for providing further control over the predetermined data process is supplied from said second inference engine means to said first inference engine means and the determination made by said determining means is provided by an interface common to at least said control means and said first inference engine means.

4. An apparatus according to claim 1 wherein said control means comprises means for interpreting the operation information supplied from said input means.

5. An apparatus according to claim 1, wherein the manually input operation information is for determining whether said second processing means will continue to provide control over said first processing means.

6. A system for supervising the status of processing performed in data processing means in which the internal status of the system changes due to an input of operation information from outside the system, comprising:

input means for inputting the operation information from outside the system;

first storage means for intermittently storing, in accordance with a predetermined timing, information data representing the internal status of said data processing means which changes due to the input of said operation information, said predetermined timing being at a second time point which occurs according to a predetermined number of the inputs of the operation information;

second storage means for storing said operation information in the order input and link information representing the relationship among said input operation information, said second storage means also storing corresponding file information representing whether or not there is a correspondence between said information data representing the internal status of said data processing means stored in said first storage means and said operation information input by said input means; and restoring means for restoring said data processing means to the internal status at a specific first time point, said restoring means comprising:

retrieval means for retrieving the operation information stored in said second storage means for defining the operation which transpired from the second time point to said specific first time point in accordance with the link information and the corresponding file information, whereby the second time point is prior to the specific first time point, and the information data representing the internal status of said data processing means corresponding to said second time point stored in said first storage means; and execution means for causing said retrieved operation information that define operations which transpired from the second time point to the specific first time point to be executed again in said data processing means using the internal status of said data processing means corresponding to said second time point and for restoring said data processing means to the internal status at the specific first time point.

7. A system according to claim 6, wherein when the information data representing the internal status of said data processing device is stored in said first storage means, said second storage means stores the operation information in the order input, and the link information and the corresponding file information are stored in said second storage means in accordance with the input of said operation information.

8. A system according to claim 6, wherein said second storage means stores the operation information in the order input, the link information and the corresponding file information whenever the operation information is input by said input means.

9. A system according to claim 6, wherein said second storage means stores the input operation information in the order input, the link information and the corresponding file information at an interval shorter than an interval defined by the predetermined timing by which said first storage means conducts its storage operation.

10. A system according to claim 6, which further comprises:

means for displaying the operation information, the link information and the corresponding file information stored in said second storage means; and determining means for determining the status at said specific first time point in accordance with the status of said operation information presently being displayed by said displaying means.

11. In an apparatus for supervising the status of processing performed in first processing means having a first knowledge base, first inference engine means for making an inference with reference to said first knowledge base and data processing means for providing control for conducting a predetermined data process in accordance with the inference made by said first inference engine means, said apparatus comprising:

second processing means having a second knowledge base and second inference engine means for making an inference with reference to said second knowledge base for the purpose of providing further control over the predetermined data process conducted in said first processing means;

determining means having input means for manually inputting necessary operation information for providing further control over the predetermined data process, said determining means in response to the input means determining whether or not said second processing means should provide further control over the predetermined data process conducted in said first processing means; and control means for causing said second processing means to start the predetermined data process conducted in said first processing means when said determining means determines that said second processing means is to provide further control over said first processing means or for causing said first processing system means to start the predetermined data process when said determining means determines that said second processing means is not to provide further control over said first processing means.

12. An apparatus according to claim 11, wherein said input means input necessary operation information for determining whether or not said second processing system is to provide further control over the predetermined data process, wherein said first inference engine means is connected to each of said second inference engine means and said input means by said control means, and wherein information data for providing further control over the predetermined data process is supplied from said second inference engine means to said first inference engine means, and the determination made by said determining means is provided by an interface common to at least said control means and said first inference engine means.

13. An apparatus according to claim 11, wherein said control means comprises means for interpreting the operation information supplied from said input means.

14. An apparatus according to claim 11, wherein the manually input operation information is for determining whether said second processing means will continue to provide control over said first processing means.

15. An apparatus for supervising the status of processing performed in a system to be supervised which comprises:

first processing means having a first knowledge base and first inference engine means for making an inference with reference to said first knowledge base, said first processing means providing control for conducting a predetermined data process in accordance with an inference made by said first inference engine means;

second processing means having a second knowledge base and second inference engine means for making an inference with reference to said second knowledge base for the purpose of providing further control over the predetermined process conducted in said first processing means;

determining means having input means for manually inputting necessary operation information or providing further control over the predetermined data process, said determining means in response to the input means determining whether or not said second processing means should provide further control over the predetermined data process conducted in said first processing means; and control means for causing said second processing means to start the predetermined process conducted in said first processing means when said determining means determines that said second processing means is to provide further control over said first processing means.

16. An apparatus according to claim 15, wherein said input means inputs necessary operation information for determining whether or not said second processing means is to provide further control over the predetermined data process, wherein said first inference engine means is connected to each of said second inference engine means and said input means by said control means, and wherein information data for providing further control over the predetermined data process is supplied from said second inference engine means to said first inference engine means, and the determination made by said determining means is provided by an interface common to at least said control means and said first inference engine means.

17. An apparatus according to claim 15, wherein said control means comprises means for interpreting the operation information supplied from said input means.

18. An apparatus according to claim 15, wherein the manually input operation information is for determining whether said second processing means will continue to provide control over said first processing means.

19. An apparatus for supervising the status of processing performed in a system to be supervised which comprises:

first processing means having a first knowledge base, first inference engine means for making an inference with reference to said first knowledge base and data processing means for providing control for conducting a predetermined data process in accordance with the inference made by said first inference engine means;

second processing means having a second knowledge base and second inference engine means for making an inference with reference to said second knowledge base for the purpose of providing further control over the predetermined data process conducted in said first processing means in accordance with the inference made by said second inference engine means; and control means having selection means for selecting an operation for the predetermined data process, said control means in response to the selection means causing said second processing means to start the predetermined data process conducted in said first processing means through said second processing means or for causing said first processing means to start the predetermined data process in accordance with said control means.

* * * * *

UNITED STATES PATENT AND TRADEMARK OFFICE
CERTIFICATE OF CORRECTION

PATENT NO. : 5,204,936

DATED : April 20, 1993

INVENTOR(S) : KAZUE KANEKO, ET AL.

It is certified that error appears in the above-identified patent and that said Letters Patent is hereby corrected as shown below:

Title Page:
IN [56] REFERENCES CITED

Under U.S. PATENT DOCUMENTS:
"4,468,763" should read --4,868,763--;
"Kogcz et al." should read --Kogge et al.--;
"Hertsog" should read --Hartsog--.

Under OTHER PUBLICATIONS:
"Jiroying et al." should read --Jiaoying et al.--.

COLUMN 1

Line 23, "place" should be deleted.
Line 44, "be" (second occurrence) should be deleted.
Line 67, "leads" should read --leads to--.

COLUMN 2

Line 16, "prior" should read --prior to--.
Line 33, "from" should read --from the--.

COLUMN 3

Line 5, "Also" should read --Also,--.

COLUMN 5

Line 46, "embodiments)" should read --embodiment)--.
Line 49, "Deign)" should read --Design)--.
Line 64, "FIG. 1" should read --FIG. 1 is--.

UNITED STATES PATENT AND TRADEMARK OFFICE
CERTIFICATE OF CORRECTION

PATENT NO. : 5,204,936

DATED : April 20, 1993

INVENTOR(S) : KAZUE KANEKO, ET AL.

It is certified that error appears in the above-identified patent and that said Letters Patent is hereby corrected as shown below:

COLUMN 10

Line 32, "is" (second occurrence) should be deleted.
Line 38, "status" should read --status is--.
Line 60, "54" should read --54;--.
Line 62, "56" should read --56; and--.
Line 65, "56" should read --56.--.

COLUMN 11

Line 33, "a" (second occurrence) should read --an--.
Line 37, "Name" should read --Name:--.
Line 41, "status" should read --status:--.
Line 44, "list" should read --list:--.
Line 51, "name" should read --name:--.
Line 63, "list" should read --list:--.

COLUMN 12

Line 41, "display" (second occurrence) should read --displayed--.
Line 59, "54" should read --54;--.
Line 61, "status" should read --status;--.
Line 64, "passed" should read --passed;--.
Line 66, "conducted" should read --conducted; and--.

COLUMN 15

Line 67, "take" should read --taken--.

UNITED STATES PATENT AND TRADEMARK OFFICE
CERTIFICATE OF CORRECTION

PATENT NO. : 5,204,936
DATED : April 20, 1993
INVENTOR(S) : KAZUE KANEKO, ET AL.

It is certified that error appears in the above-identified patent and that said Letters Patent is hereby corrected as shown below:

COLUMN 17

Line 40, "claim 1" should read --claim 1,--.

Signed and Sealed this

Seventh Day of June, 1994

Attest:

*Attesting Officer*

BRUCE LEHMAN
*Commissioner of Patents and Trademarks*